(12) United States Patent
Tsai et al.

(10) Patent No.: US 11,462,524 B2
(45) Date of Patent: Oct. 4, 2022

(54) LIGHT EMITTING STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Jie-Ting Tsai, New Taipei (TW); Kuo-Ming Chiu, New Taipei (TW); Wei-Te Cheng, Taipei (TW); Kai-Chieh Liang, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/899,686

(22) Filed: Jun. 12, 2020

(65) Prior Publication Data
US 2020/0395517 A1    Dec. 17, 2020

Related U.S. Application Data

(60) Provisional application No. 62/860,883, filed on Jun. 13, 2019.

(30) Foreign Application Priority Data

May 7, 2020 (CN) .......... 202010384406.X

(51) Int. Cl.
| | | |
|---|---|---|
| *H01L 25/16* | (2006.01) | |
| *H01L 33/62* | (2010.01) | |
| *H01L 23/485* | (2006.01) | |
| *H01L 25/075* | (2006.01) | |
| *H01L 33/50* | (2010.01) | |
| *H01L 33/58* | (2010.01) | |

(Continued)

(52) U.S. Cl.
CPC .......... *H01L 25/167* (2013.01); *F21V 31/005* (2013.01); *H01L 23/485* (2013.01);
(Continued)

(58) Field of Classification Search
CPC ..... H01L 25/167; H01L 33/405; H01L 33/60; H01L 2924/181
See application file for complete search history.

(56) References Cited

U.S. PATENT DOCUMENTS

2014/0319553 A1* 10/2014 Ye .......................... H01L 33/504
257/89
2015/0036083 A1* 2/2015 Jang .................. G02F 1/136209
349/96

(Continued)

FOREIGN PATENT DOCUMENTS

CN        201103846 Y      8/2008
CN        102884016 A      1/2013
(Continued)

*Primary Examiner* — Jay C Chang
*Assistant Examiner* — Mikka Liu
(74) *Attorney, Agent, or Firm* — Li & Cai Intellectual Property (USA) Office

(57) ABSTRACT

A light emitting structure includes a substrate, at least one light emitting chip disposed on the substrate and, a side wall disposed on the substrate and surrounding the at least one light emitting chip, a cover disposed on the side wall, an anti-reflective coating disposed on the cover, and a protective layer disposed on outside of the cover, wherein the cover, the side wall and the substrate define an enclosed space for accommodating the at least one light emitting chip.

20 Claims, 8 Drawing Sheets

(51) Int. Cl.
*F21V 31/00* (2006.01)
*H01L 33/40* (2010.01)
*H01L 33/56* (2010.01)
*H01L 33/60* (2010.01)

(52) U.S. Cl.
CPC ........ *H01L 25/0753* (2013.01); *H01L 33/405* (2013.01); *H01L 33/502* (2013.01); *H01L 33/505* (2013.01); *H01L 33/56* (2013.01); *H01L 33/58* (2013.01); *H01L 33/60* (2013.01); *H01L 33/62* (2013.01)

(56) References Cited

U.S. PATENT DOCUMENTS

2015/0102375 A1* 4/2015 Kim .................... H01L 33/56
257/98
2018/0067339 A1* 3/2018 Miyamoto ............... G02B 5/28
2020/0124770 A1* 4/2020 Maruyama ............ H01L 33/486

FOREIGN PATENT DOCUMENTS

| | | | |
|---|---|---|---|
| CN | 104540676 | A | 4/2015 |
| CN | 106531858 | A | 3/2017 |
| CN | 108807636 | A | 11/2018 |
| KR | 1020140017249 | A | 2/2014 |
| KR | 1020140098523 | A | 8/2014 |
| TW | M530478 | U | 10/2016 |
| TW | 201705539 | A | 2/2017 |
| TW | 201743476 | A | 12/2017 |
| WO | 2018113922 | A1 | 6/2018 |

* cited by examiner

LIGHT EMITTING STRUCTURE

CROSS-REFERENCE TO RELATED PATENT APPLICATION

This application claims the benefits of priority to China Patent Application No. 202010384406.X, filed on May 7, 2020 in People's Republic of China, and to U.S. Provisional Patent Application Ser. No. 62/860,883, filed on Jun. 13, 2019. The entire content of the above identified applications are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light emitting structure, and more particularly to a light emitting structure capable of maintaining good light emitting efficiency under long term use or high temperature and high humidity environments.

BACKGROUND OF THE DISCLOSURE

A light emitting chip has the advantages of high energy conversion efficiency, power saving, long service life, being environmentally friendly, and the like. With advances in light emitting chip technology, light emitting chips have achieved increasingly diversified applications and are widely used in various fields.

In the related art, quartz is often used as the material of a cover. However, the quartz material will absorb about 10% mW of light extraction efficiency, and the light extraction efficiency of a light emitting chip is thus reduced. In order to improve the light emitting efficiency, an anti-reflective coating is used in the related art to increase the light extraction efficiency. However, in high temperature and high humidity environments, the anti-reflective coatings are easily prone to peeling, which causes reduced light extraction efficiency. Also, it is difficult for the anti-reflective coating to continuously maintain excellent light extraction efficiency under long term use.

For the reasons described above, how the above-mentioned defects can be overcome through improvements of structural design and material selection, thus maintaining and improving the light extraction efficiency, has become one of the most important issues to be solved in the relevant field.

SUMMARY OF THE DISCLOSURE

In view of the above-mentioned technical issues in the related art, the present disclosure aims to provide a light emitting structure which can maintain good light emitting efficiency under long term use or high temperature and high humidity environments.

In order to solve the technical problem described above, one of the technical solutions adopted by the present disclosure is to provide a light emitting structure, including a substrate, at least one light emitting chip, a side wall, a cover, an anti-reflective coating, and a protective layer. The at least one light emitting chip is disposed on the substrate, the side wall is disposed on the substrate and surrounds the at least one light emitting chip; the cover is disposed on the sidewall, and the cover, the side wall and the substrate surrounds and defines an enclosed space for accommodating the at least one light emitting chip; the first anti-reflective coating is disposed on the cover, and the protective layer is disposed on outside of the cover.

Therefore, by virtue of "an anti-reflective coating disposed on at least one surface of the cover" and "a protective layer disposed on the outside of the cover", the light emitting structure provided by the present disclosure effectively improves the light extraction efficiency, and can prevent moisture intrusion into the enclosed space under long term use or high temperature and high humidity environments, and can maintain excellent light extraction efficiency for a longer period.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
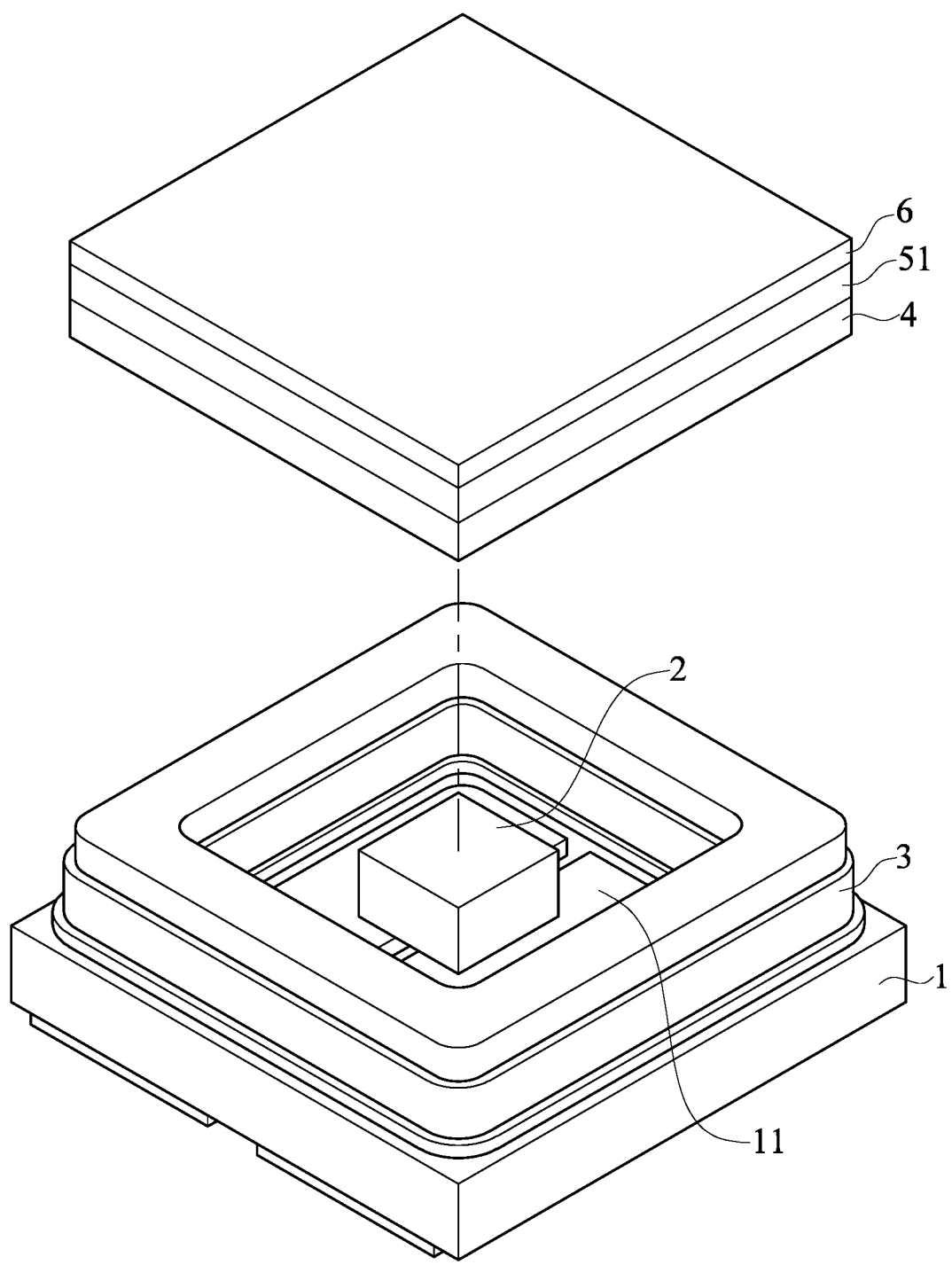
FIG. 1 is a schematic top view of a light emitting structure of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following describes implementations related to a "light emitting structure" that are disclosed in the present disclosure through particular embodiments, and those skilled in the art can understand the advantages and effects of the present disclosure from content disclosed in this specification. The present disclosure may be implemented or applied through other various specific embodiments, and various modifications and changes may be made to details in this specification based on different opinions and applications without departing from a spirit and scope of the present disclosure. In addition, it is announced in advance that drawings of the present disclosure are merely illustrative but not delineated according to actual sizes. The following implementations will further describe in detail related technical content of the present disclosure, but the disclosed content is not intended to limit the scope of the present disclosure.

Figure 2:
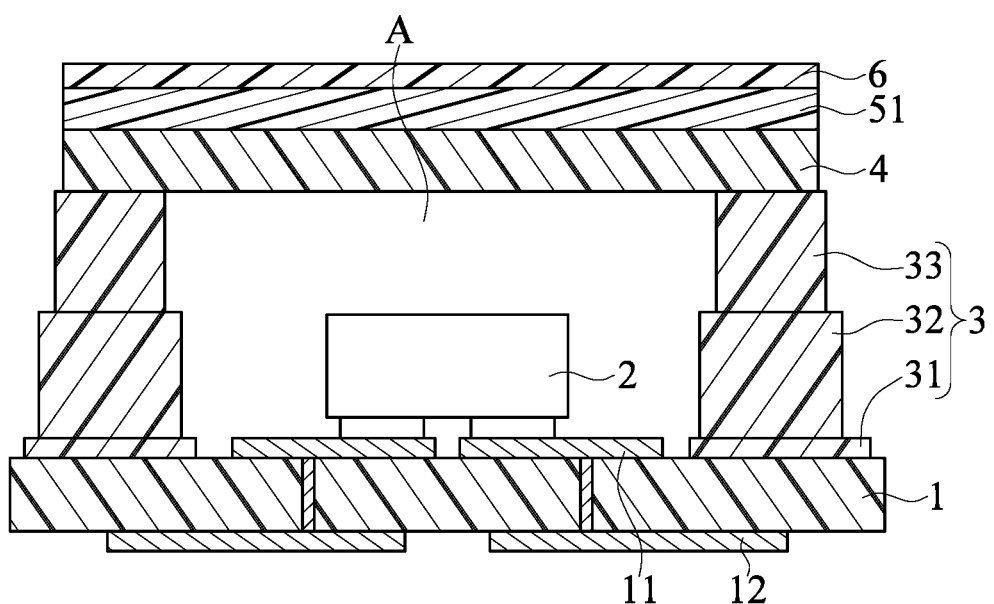
FIG. 2 is a schematic cross-sectional view of an implementation of a first embodiment of the present disclosure.

Referring to FIG. 1 and FIG. 2, the present disclosure provides a light emitting structure, including a substrate 1, at least one light emitting chip 2, a side wall 3, a cover 4, a first anti-reflective coating 51, and a protective layer 6. The cover 4 is disposed on the side wall 3, and the substrate 1, the side wall 3 and the cover 4 surrounds and defines an enclosed space for accommodating the at least one light emitting chip 2.

Specifically, the substrate 1 may be a conductive substrate or an insulating substrate, such as a ceramic substrate, an aluminum substrate, a silicon substrate, a silicon carbide substrate, an alumina substrate, or an aluminum nitride substrate, and the like. Preferably, the substrate 1 may be an AlN substrate treated with nickel/gold or nickel/palladium/gold treatment, or may be a copper substrate. In practice, the substrate 1 may be formed with a conductive structure (e.g., a conductive pad or a via), as a connection interface and a signal transmission path for the light emitting chip 2.

The at least one light emitting chip 2 of the present disclosure is an ultraviolet light emitting chip, which emits light in a wavelength range from 200 nm to 400 nm, and especially for UVC (200 nm-280 nm).

In one specific embodiment of the present disclosure, the substrate 1 and the side wall 3 may be an integrally formed structure, or the side wall 3 may be disposed on the substrate 1 by means of an adhesive. In another specific embodiment of the present disclosure, the side wall 3 and the cover 4 may be an integrally formed structure, or the cover 4 may be disposed on the side wall 3 by means of an adhesive. In other words, the substrate 1 and the side wall 3, and the side wall 3 and the cover 4 are integrally formed structures, respectively, or the substrate 1 and the cover 4 may be joined to the side wall 3 by an adhesive, respectively. However, when the adhesive is used, a heterojunction may be formed. Therefore, the present disclosure further provides a protective layer 6 to cover the junction, thereby avoiding moisture intrusion that might affect the enclosed space.

Furthermore, with reference to FIG. 1 and FIG. 2, the side wall 3 may be a metal material, such as copper, but is not limited thereto; and the side wall 3 may be sequentially stacked and deposited on the substrate by electroplating, so as to form a multi-layer structure having a stepped shape. For example, with reference to FIG. 1 and FIG. 2, during the formation of the side wall 3, a bottom layer 31 as a first layer is first formed on the substrate 1, and then an intermediate layer 32 as a second layer is formed on the bottom layer 31 of the first layer, and after that, a top layer 33 as a third layer is formed on the intermediate layer 32 of the second layer. The side wall 3 having a multi-layer structure is formed by sequential stacking and deposition on the substrate 1. In this embodiment, the side wall 3 includes a bottom layer 31, an intermediate layer 32, and a top layer 33 as an example, but the side wall 3 of the present disclosure is not limited thereto. Furthermore, the bottom layer 31 may be defined in the same process as a first electrode layer 11 of the substrate 1, so as to form a preset circuit on a surface of the substrate 1 (e.g., a metal profile), and the light emitting chip 2 may be fixed on the first electrode layer 11 of the substrate 1 by means of a PN electrode, and the first electrode layer 11 may be connected to a second electrode layer 12 on the opposite side of the substrate 1 by means of a through hole. However, the present disclosure is not limited thereto. The side wall 3 of the present disclosure may also be a non-metal material, or the side wall 3 may also be of a hollow columnar structure (as shown in FIG. 3A to FIG. 5C). Also, the surface of the side wall 3 opposite to the light emitting chip 2 may be formed with a reflective layer to improve the light extraction efficiency. The material of the reflective layer may be a material with high reflectivity, which may be selected from aluminum plus an antioxidant layer, Teflon, and a photonic crystal film. In the related art, gold or aluminum oxide ($Al_2O_3$) is often used as the reflective layer.

The cover 4 may be in different forms, such as a planar lens, a dome lens, a hollow dome lens, or a hollow square lens (in the shape of a rectangular arch), depending on the requirements of the light emitting chip. Preferably, the material of the cover 4 has a refractive index of 1.4, for example quartz glass.

Specifically, a first anti-reflective coating 51 is disposed on the cover 4, and the anti-reflective coating may be disposed on either side or both sides of the cover 4 to improve the light extraction efficiency. That is to say, a second anti-reflective coating 52 disposed on the side opposite to the first anti-reflective coating 51 may be further included. In particular, providing the first anti-reflective coating 51 increases the light emitting efficiency by 3% mW to 4% mW, and providing the anti-reflective coating on both sides may increase the light emitting efficiency by about 6% mW to 9% mW. The first anti-reflective coating 51 or the second anti-reflective coating 52 may be applied to the complete surface, or may be applied to only part of the light extraction surface.

The thickness of the first anti-reflective coating 51 or the second anti-reflective coating 52 is between 30 nm and 120 nm, preferably between 60 nm and 90 nm. The materials of the first anti-reflective coating 51 and the second anti-reflective coating 52 may be selected from silicon dioxide with oxide, such as $SiO_2$ with $HfO_2$ or $SiO_2$ with $Ta_2O_5$. Preferably, the anti-reflective coating 51 has a refractive index of 1.35, similar to the protective layer 6.

Specifically, the protective layer 6 is disposed on the first anti-reflective coating 51, and the thickness of the protective layer 6 is between 30 nm and 120 nm, preferably between 60 nm and 90 nm, and meets the formula: the thickness of the protective layer (T)=the emission wavelength (λ) of the light emitting chip/4.

More particularly, the protective layer 6 is a fluorine-based polymer, magnesium fluoride or silicon dioxide with a transmittance of greater than 90% at a wavelength of 265 nm to 285 nm. For example, the protective layer 6 may be an amorphous fluoride, a fluorine-based polymer having a hydroxyl group that has a transmittance of greater than 90% at a wavelength of 265 nm to 285 nm, and a refractive index of 1.35 at a wavelength of 275 nm. The fluorine-based polymer having a hydroxyl group is a non-crystalline, highly transparent fluoropolymer (perfluoro(1-butenyl vinyl ether) polymer) with a terminal functional group of COOH, for example, as shown in the following structure: COOH—$(CF_2$=$CFCF_2CF_2$—O—CF=$CF_2)_m$—COOH, where m is a positive integer from 18 to $1.5*10^5$. In particular, the fluorine-based polymer having a hydroxyl group possesses a water contact angle of about 112 degrees, and thus has excellent hydrophobic property and low permeability property.

In addition, the anti-reflective coating in combination with the protective layer provides the advantage of maintaining excellent light emitting efficiency after a long period of time, as shown in Table 1 below (ambient temperature/humidity of 60° C./RH 90%):

TABLE 1

| Time | 504 hr | 672 hr | 840 hr | 1000 hr | 1500 hr | 2000 hr |
|---|---|---|---|---|---|---|
| Anti-reflective coating (light extraction percentage from initial brightness) | 87% | 86% | 85% | 85% | 80% | 75% |
| Anti-reflective coating in combination with protective layer (light extraction percentage from initial brightness) | 89% | 90% | 89% | 89% | 89% | 89% |

In detail, the light emitting from the light emitting chip passes through the light emitting structure in the order of air, the second anti-reflective coating 52, cover 4, the first anti-reflective coating 51, the body portion 61 of the protective layer 6 and the air outside of the light emitting structure. The refractive index of air is 1, at 275 nm the refractive index of the second anti-reflective coating 52 is 1.35, the refractive index of the cover 4 is 1.4 (high), the refractive index of the first anti-reflective coating 51 is 1.35 (low), the refractive index of the body portion 61 of the protective layer 6 is 1.35 (low); such that, the feature of high-low reflective multi-layer structure of the present disclosure increases the light extraction efficiency.

Furthermore, the implementations of the light emitting structure of the present disclosure are further illustrated below by way of a first embodiment through a third embodiment.

First Embodiment

Referring to FIG. 3A to FIG. 3D, the first embodiment of the present disclosure provides a schematic cross-sectional view of a light emitting structure including a substrate 1, at least one light emitting chip 2, a side wall 3, a cover 4, a first anti-reflective coating 51, and a protective layer 6. The light emitting chip 2 is disposed on the substrate 1, and the quantity of the light emitting chip 2 is at least one but may be increased as desired. The side wall 3 is disposed on the substrate 1 and is integrally formed with the substrate 1, and the side wall 3 surrounds the light emitting chip 2. The cover 4 includes opposing first and second surfaces 41, 42, and the second surface 42 is disposed on the side wall 3. The cover 4, the side wall 3 and the substrate 1 surrounds and defines an enclosed space A for accommodating the at least one light emitting chip 2. Furthermore, the first anti-reflective coating 51 is disposed on the first surface 41 of the cover 4, and the protective layer 6 is disposed on the first anti-reflective coating 51.

Figure 3A:
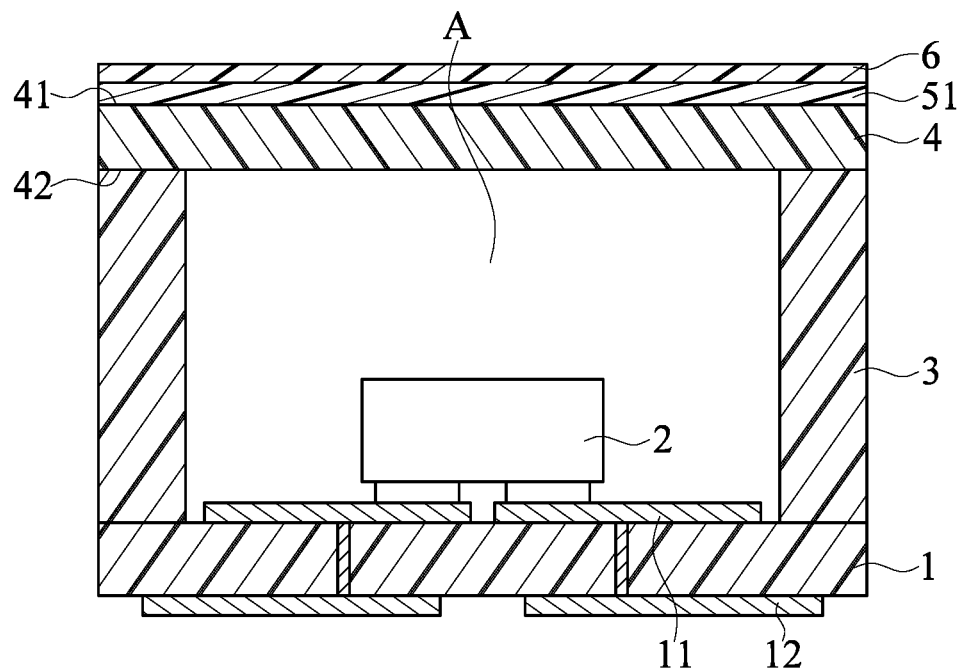
FIG. 3A is a schematic cross-sectional view of an implementation of the first embodiment of the present disclosure.
Figure 3B:
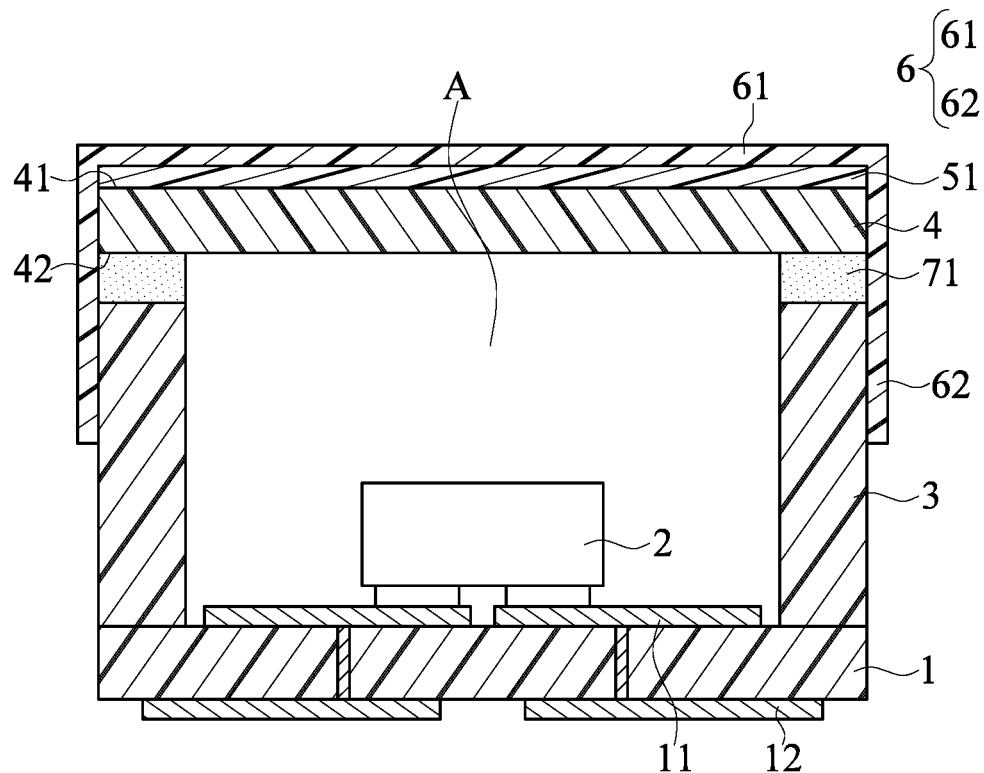
FIG. 3B is a schematic cross-sectional view of another implementation of the first embodiment of the present disclosure.
Figure 3C:
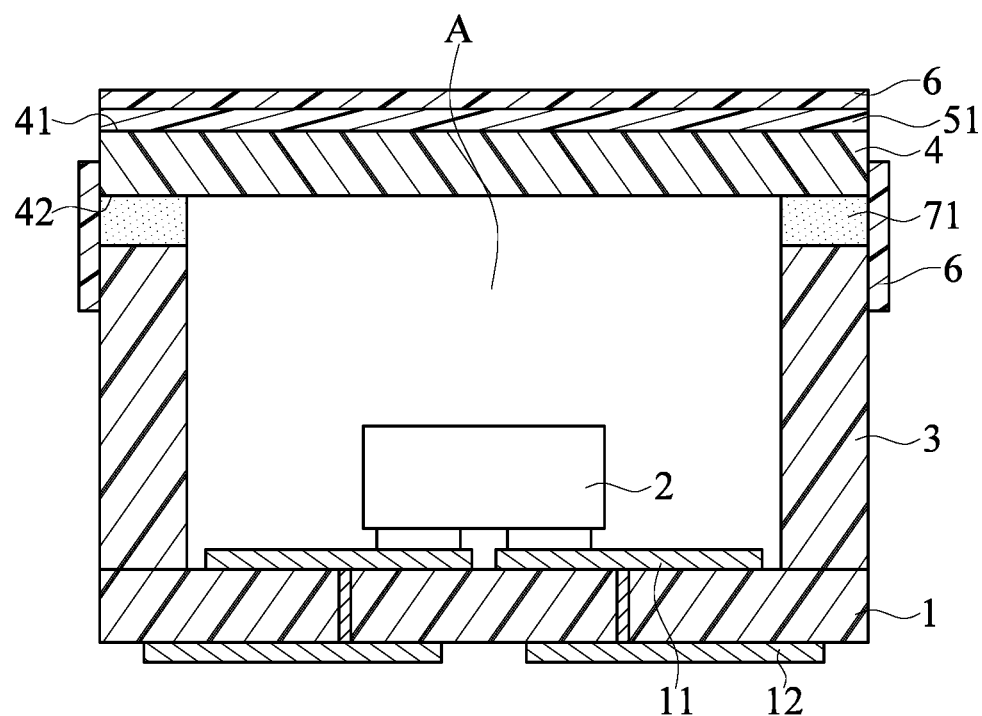
FIG. 3C is a schematic cross-sectional view of yet another implementation of the first embodiment of the present disclosure.

Referring to FIG. 3B, an adhesive, i.e., a first adhesive 71, is disposed at the junction of the side wall 3 and the cover 4. The first adhesive 71 may surround the side wall 3, and through the layout of the first adhesive 71, the cover 4 can be fixed on the side wall 3, and the accommodating enclosed space A described above can be sealed. Furthermore, the protective layer 6 extends to cover the position beyond the first adhesive 71. That is to say, the protective layer 6 includes a body portion 61 and an extension portion 62 connected to the body portion 61. The body portion 61 is located on the first anti-reflective coating 51, and the extension portion 62 extends towards the side wall 3 at the side of the body portion 61 to cover the first anti-reflective coating 51, the cover 4, the first adhesive 71, and a part of the side of the side wall 3, thereby preventing moisture from intruding into the enclosed space A described above. Moreover, with reference to FIG. 3C, the protective layer 6 may also be disposed on the first surface 41 of the cover 4 and separately surround the position where the first adhesive 71 is located, and extend upward to cover part of the cover 4 and extend downward to cover part of the side wall 3.

Figure 3D:
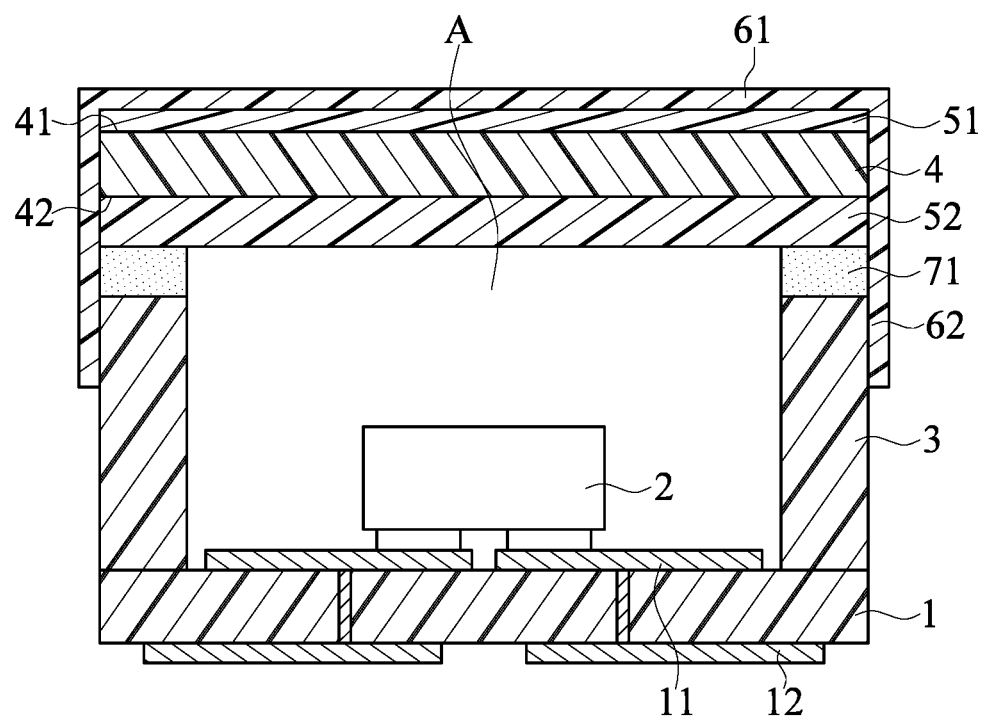
FIG. 3D is a schematic cross-sectional view of still another implementation of the first embodiment of the present disclosure.

Further, referring to FIG. 3D, the light emitting structure of the present disclosure also includes a second anti-reflective coating 52 disposed on the second surface 42 of the cover 4, and the second anti-reflective coating 52 may completely or partially cover the second surface 42. Providing the first anti-reflective coating 51 on the cover 4 can increase the light extraction efficiency by 3% mW to 4% mW, while providing both the first anti-reflective coating 51 and the second anti-reflective coating 52 can increase the light extraction efficiency by about 6% mW to 9% mW. In addition, the protective layer 6 of the present disclosure may only cover the upper surface of the first anti-reflective coating 51 as illustrated in FIG. 3A, and may also extend downward to cover the first anti-reflective coating 51, the cover 4, the second anti-reflective coating 52, the first adhesive 71, and a part of the side wall 3, as illustrated in FIG. 3D, to protect the anti-reflective coating from moisture. The protective layer 6 may further extend at the side to cover the first adhesive 71 and the outer portion of the side wall 3, which can further prevent moisture from intruding into the enclosed space A described above.

In other words, the light emitting structure of the present disclosure may also include a substrate 1, at least one light emitting chip 2, and a cover 4. The at least one light emitting chip 2 is disposed on the substrate 1. The cover 4 and the substrate 1 are joined to each other and form an enclosed storage space A to accommodate at least one light emitting chip 2. A first surface 41 of the cover 4 further includes a first anti-reflective coating 51 and a protective layer 6 disposed on the first anti-reflective coating 51. A second surface 42 of the cover 4 may further include a second anti-reflective coating 52.

Further, at least one adhesive is disposed at the junction of the cover 4 and the substrate 1, wherein the protective layer 6 of the cover 4 has an extension portion 62 covering the at least one adhesive. Further, the substrate 1 may further include a side wall 3. A first adhesive 71 is disposed at the junction of the side wall 3 and the cover 4, and the first adhesive 71 is covered by the extension portion 62 of the protective layer 6.

Second Embodiment

Referring to FIG. 4A to FIG. 4D, the second embodiment of the present disclosure provides a schematic cross-sectional view of another light emitting structure including a substrate 1, at least one light emitting chip 2, a side wall 3, a cover 4, a first anti-reflective coating 51, and a protective layer 6. The light emitting chip 2 is disposed on the substrate 1, and the quantity of the light emitting chip 2 is at least one but may be increased as desired. The side wall 3 is disposed on the substrate 1, and the side wall 3 surrounds the light emitting chip 2. The cover 4 is disposed on the side wall 3 and is integrally formed with the side wall 3. The cover 4 includes opposing first and second surfaces 41, 42, and the second surface 42 is connected to the side wall 3. The cover 4, the side wall 3, and the substrate 1 surrounds and defines an enclosed space A for accommodating the at least one light emitting chip 2. Furthermore, the first anti-reflective coating 51 is disposed on the first surface 41 of the cover 4, and the protective layer 6 is disposed on the first anti-reflective coating 51.

Figure 4A:
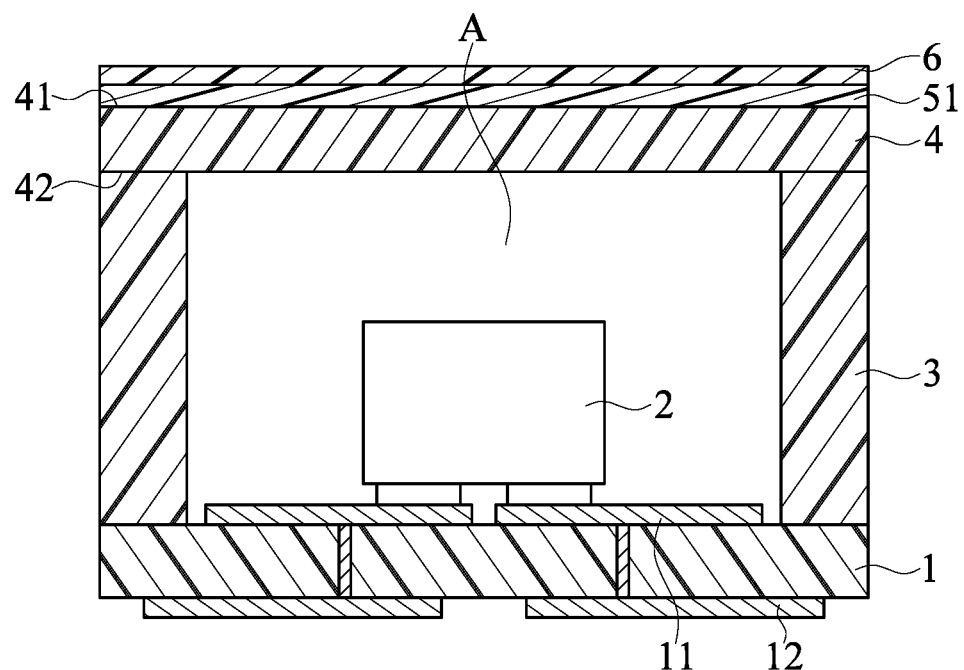
FIG. 4A is a schematic cross-sectional view of an implementation of a second embodiment of the present disclosure.
Figure 4B:
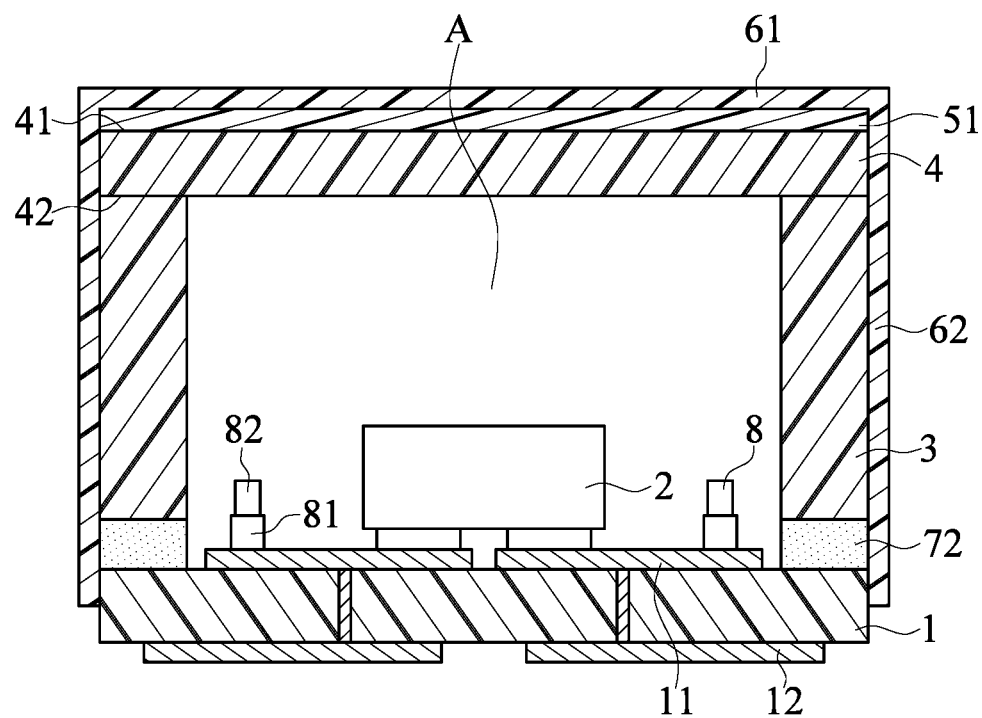
FIG. 4B is a schematic cross-sectional view of another implementation of the second embodiment of the present disclosure.
Figure 4C:
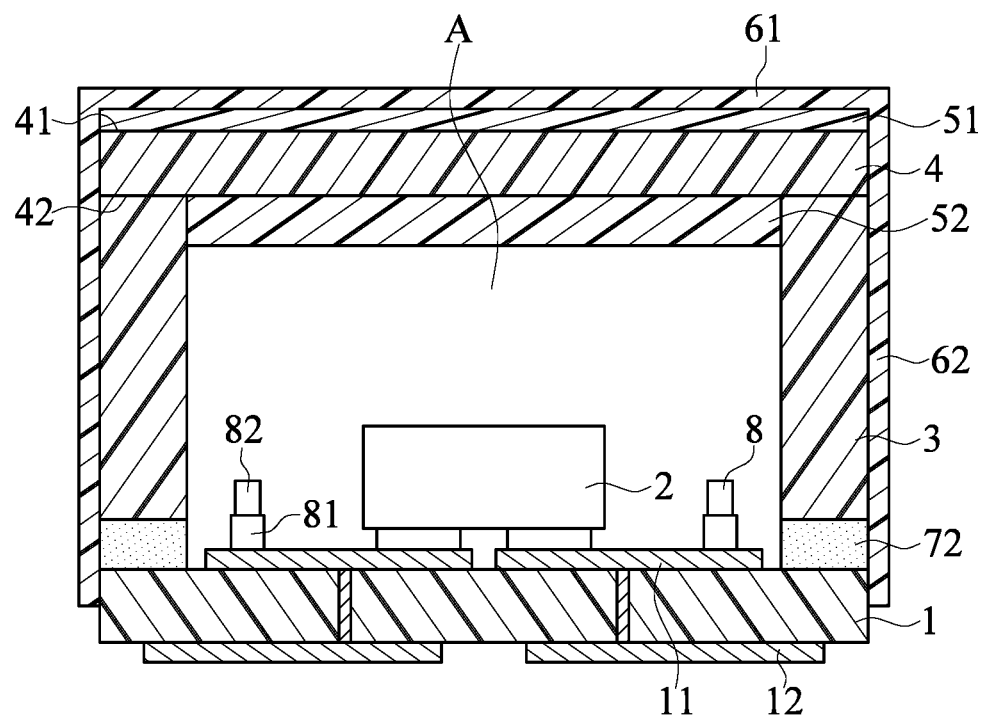
FIG. 4C is a schematic cross-sectional view of yet another implementation of the second embodiment of the present disclosure.

Referring to FIG. 4B and FIG. 4C, an adhesive, i.e., a second adhesive 72, is disposed at the junction of the side wall 3 and the substrate 1, and through the layout of the second adhesive 72, the side wall 3 can be fixed on the substrate 1 and the enclosed space A described above can be sealed. Furthermore, the protective layer 6 extends to cover the position beyond the second adhesive 72. That is to say, the protective layer 6 includes a body portion 61 and an extension portion 62 connected to the body portion 61. The body portion 61 is located on the first anti-reflective coating 51, and the extension portion 62 extends towards the substrate 1 at the side of the body portion 61 to cover the first anti-reflective coating 51, the cover 4, the side wall 3, the second adhesive 72, and a part of the side of the substrate 1, thereby preventing moisture from intruding into the enclosed space A described above.

Further, referring to FIG. 4C, the light emitting structure of the present disclosure also includes a second anti-reflective coating 52 disposed on the second surface 42 of the cover 4, and the second anti-reflective coating 52 may completely or partially cover the second surface 42. Providing the first anti-reflective coating 51 on the cover 4 can increase the light extraction efficiency by 3% mW to 4% mW, while providing both the first anti-reflective coating 51 and the second anti-reflective coating 52 can increase the light extraction efficiency by about 6% mW to 9% mW.

Figure 4D:
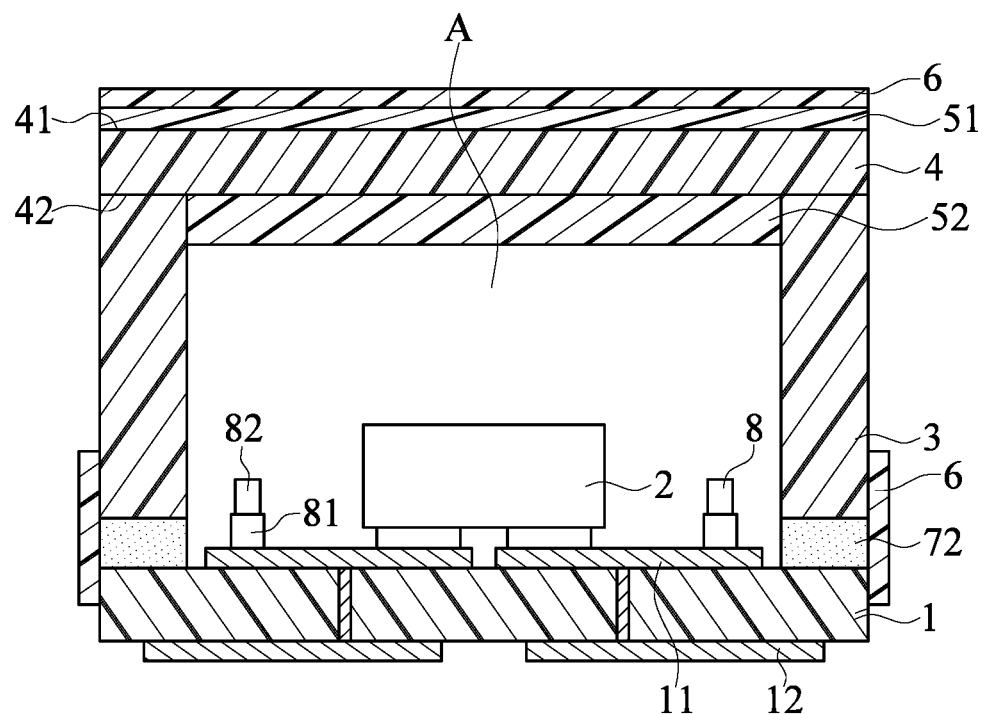
FIG. 4D is a schematic cross-sectional view of still another implementation of the second embodiment of the present disclosure.

Moreover, with reference to FIG. 4D, the protective layer 6 may also be disposed on the first surface 41 of the cover 4 and separately surround the position where the second adhesive 72 is located, and extend upward to cover part of the side wall 3 and extend downward to cover part of the substrate 1.

In addition, as shown in FIG. 4B to FIG. 4D, the light emitting structure of the present disclosure further includes a blocking structure 8, and the blocking structure 8 is disposed on the substrate 1 to provide a predetermined distance between the side wall 3 and the at least one light emitting chip 2. In other words, the blocking structure 8 is a limiting means disposed on the substrate 1 such that the position of the side wall 3 may be located according to a predetermined distance and position. The blocking structure 8 may be integrally formed with the substrate 1 or may be a separate structure from the substrate 1. In addition, the material of the blocking structure 8 may be the same as that of the substrate 1, such as ceramics, aluminum, silicon, silicon carbide, alumina, or aluminum nitride, and the like, or may be another ultraviolet resistant material. As such, the blocking structure 8 is disposed between the at least one light emitting chip 2 and the second adhesive 72, and can block ultraviolet light emitted by the at least one light emitting chip 2, so as to prevent direct irradiation onto the second adhesive 72 that leads to aging. Moreover, the blocking structure 8 may also be a metal material, such as copper, but is not limited thereto; and the blocking structure 8 may be sequentially stacked on the substrate 1 in a multilayer structure by electroplating. The formation of the blocking structure 8 may be similar to that of the side wall 3 described above. For example, as shown in FIG. 4B to FIG. 4D, the blocking structure 8 may include a base portion 81 and a top portion 82, but the blocking structure 8 of the present disclosure is not limited thereto. The blocking structure 8 and the step-shaped side wall 3 may be simultaneously formed on the substrate 1. Alternatively, one of the side wall 3 or the blocking structure 8 can first be formed before the other one is formed.

In other words, the light emitting structure of the present disclosure may also include a substrate 1, at least one light emitting chip 2, and a cover 4. The at least one light emitting chip 2 is disposed on the substrate 1. The cover 4 and the substrate 1 are joined to each other and form an enclosed storage space A to accommodate at least one light emitting chip 2. A first surface 41 of the cover 4 further includes a first anti-reflective coating 51 and a protective layer 6 disposed on the first anti-reflective coating 51. A second surface 42 of the cover 4 may further include a second anti-reflective coating 52.

Further, at least one adhesive is disposed at the junction of the cover 4 and the substrate 1, wherein the protective layer 6 of the cover 4 has an extension portion 62 covering the at least one adhesive. Further, the cover 4 may further include a side wall 3. A second adhesive 72 is disposed at the junction of the side wall 3 and the substrate 1, and the second adhesive 72 is covered by the extension portion 62 of the protective layer 6.

Third Embodiment

Figure 5A:
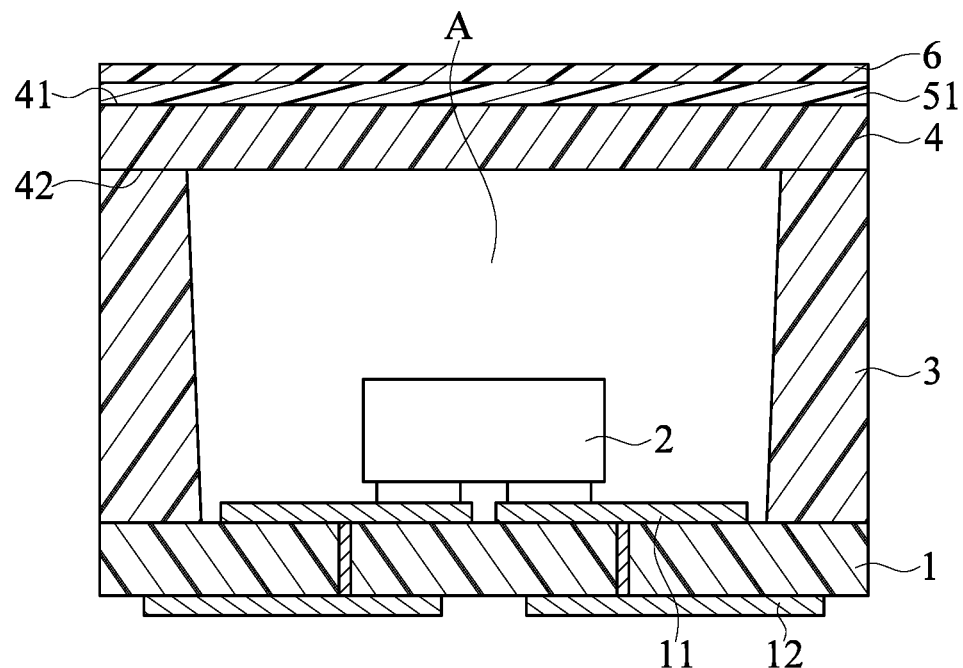
FIG. 5A is a schematic cross-sectional view of an implementation of a third embodiment of the present disclosure.
Figure 5B:
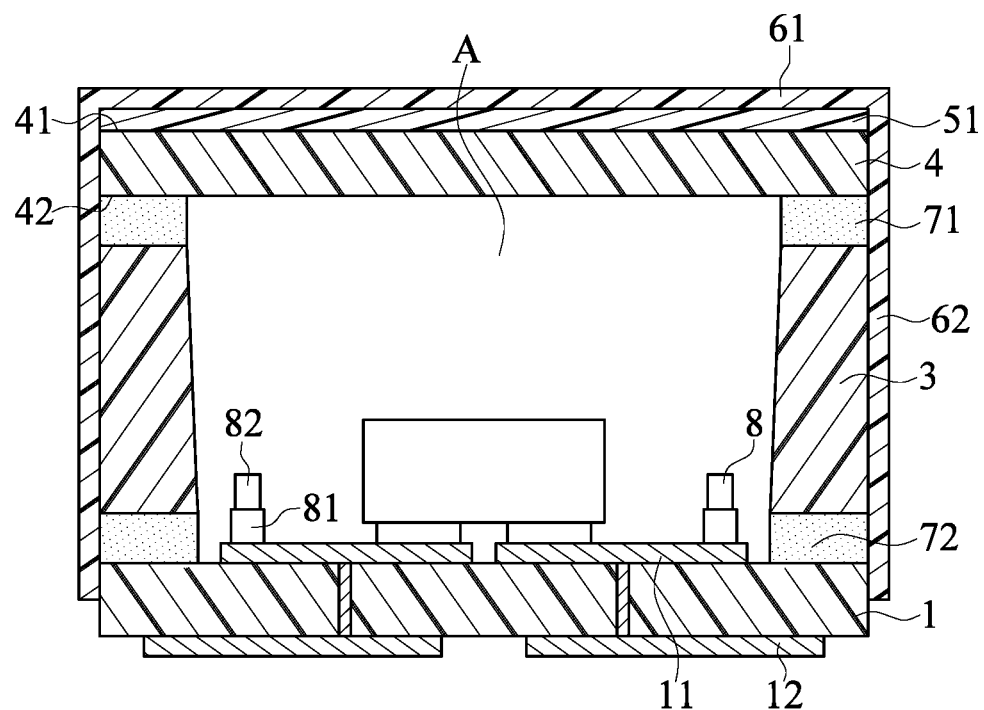
FIG. 5B is a schematic cross-sectional view of another implementation of the third embodiment of the present disclosure.
Figure 5C:
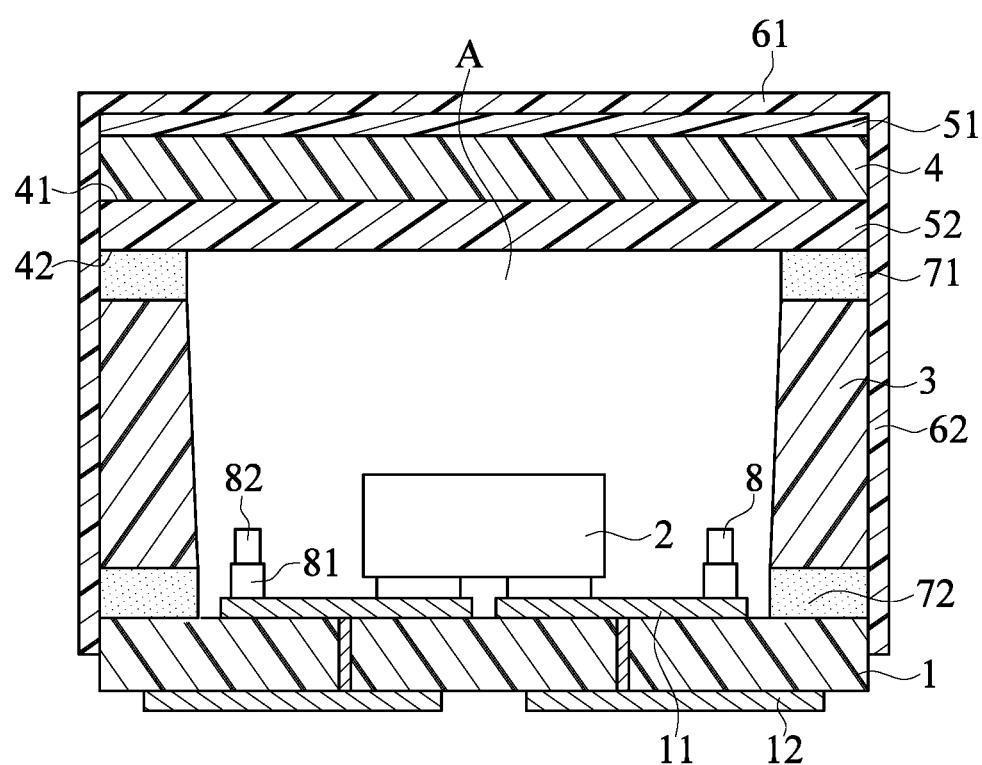
FIG. 5C is a schematic cross-sectional view of yet another implementation of the third embodiment of the present disclosure.

Referring to FIG. 5A to FIG. 5C the third embodiment of the present disclosure provides a schematic cross-sectional view of still another light emitting structure including a substrate 1, at least one light emitting chip 2, a side wall 3, a cover 4, a first anti-reflective coating 51, and a protective layer 6. The light emitting chip 2 is disposed on the substrate 1, and the quantity of the light emitting chip 2 is at least one but may be increased as desired. The side wall 3 is disposed on the substrate 1, and the side wall 3 surrounds the light emitting chip 2, wherein the side profile of the side wall 3 may be stepped shape, vertical shape (perpendicular to the substrate 1) or inclined shape. In this embodiment, the inclined shape is shown as an example, but is not limited thereto. The cover 4 is disposed on the side wall 3 and is integrally formed with the side wall 3. The cover 4 includes opposing first and second surfaces 41, 42, and the second surface 42 is connected to the side wall 3. The cover 4, the side wall 3 and the substrate 1 surrounds and defines an enclosed space A for accommodating the at least one light emitting chip 2. Furthermore, the first anti-reflective coating 51 is disposed on the first surface 41 of the cover 4, and the protective layer 6 is disposed on the first anti-reflective coating 51.

Referring to FIG. 5B and FIG. 5C, a first adhesive 71 is disposed at the junction of the side wall 3 and the cover 4, and a second adhesive 72 is disposed at the junction of the side wall 3 and the substrate 1. The first adhesive 71 and the second adhesive 72 may surround the side wall 3. The cover 4 is fixed on the side wall 3 by the first adhesive 71, and the side wall 3 is fixed on the substrate 1 by the second adhesive 72, and the enclosed space A described above is sealed Furthermore, the protective layer 6 extends to cover the position beyond the second adhesive 72. That is to say, the protective layer 6 includes a body portion 61 and an extension portion 62 connected to the body portion 61. The body portion 61 is located on the first anti-reflective coating 51, and the extension portion 62 extends towards the substrate 1 at the side of the body portion 61 to sequentially cover the first anti-reflective coating 51, the cover 4, the second anti-reflective coating 52 (optional), the first adhesive 71, the side wall 3, the second adhesive 72, and a part of the side of the substrate 1, so that all joints resulting from non-integral formation are covered, thereby preventing moisture from intruding into the enclosed space A described above.

Further, referring to FIG. 5C, the light emitting structure of the present disclosure also includes a second anti-reflective coating 52 disposed on the second surface 42 of the cover 4, and the second anti-reflective coating 52 may completely or partially cover the second surface 42. Providing the first anti-reflective coating 51 on the cover 4 can increase the light extraction efficiency by 3% mW to 4% mW, while providing both the first anti-reflective coating 51 and the second anti-reflective coating 52 can increase the light extraction efficiency by about 6% mW to 9% mW.

In addition, as shown in FIG. 5B and FIG. 5C, the light emitting structure of the present disclosure further includes a blocking structure 8, and the blocking structure 8 is disposed on the substrate 1 to provide a predetermined distance between the side wall 3 and the at least one light emitting chip 2. In other words, the blocking structure 8 is a limiting means disposed on the substrate 1 such that the side wall 3 position may be located according to a predetermined distance and position. The blocking structure 8 may be integrally formed with the substrate 1 or may be a separate structure from the substrate 1. In addition, the material of the blocking structure 8 may be the same as that of the substrate 1, such as ceramics, aluminum, silicon, silicon carbide, alumina, or aluminum nitride, and the like, or may be another ultraviolet resistant material. As such, the blocking structure 8 is disposed between the at least one light emitting chip 2 and the second adhesive 72, and can block ultraviolet light emitted by the at least one light emitting chip 2, so as to prevent direct irradiation onto the second adhesive 72 that leads to aging. Moreover, the blocking structure 8 may also be a metal material, such as copper, but is not limited thereto; and the blocking structure 8 may be sequentially stacked on the substrate 1 in a multilayer structure by electroplating. The formation of the blocking structure 8 may be similar to that of the side wall 3 described above. For example, as shown in FIG. 5B and FIG. 5C, the blocking structure 8 may include a base portion 81 and a top portion 82, but the blocking structure 8 of the present disclosure is not limited thereto. The blocking structure 8 and the step-shaped side wall 3 may be simultaneously formed on the substrate 1. Alternatively, one of the side wall 3 or the blocking structure 8 can first be formed before the other one is formed.

Advantageous Effects of the Embodiments

Therefore, by virtue of "an anti-reflective coating 51,52 disposed on at least one surface of the cover 4" and "a protective layer 6 disposed on the outside of the cover 4", the light emitting structure provided by the present disclosure effectively improves the light emitting efficiency, and can maintain the light extraction efficiency for a longer period.

Moreover, the present disclosure provides the feature "the refractive index of the anti-reflective coating is similar to the refractive index of protective layer and the refractive index of cover is larger than to the refractive index of protective layer and the anti-reflective coating", in detail, the light emits from the light emitting chip pass through the light emitting structure in the order of air, cover, the anti-reflective coating, the protective layer and the air outside of the light emitting structure, and the refractive indexes of these light passing mediums in sequential are 1, 1.4, 1.35, and 1.35; such that, the feature of the present disclosure increases the light extraction efficiency.

Specifically, providing the first anti-reflective coating 51 on the cover 4 can increase the light extraction efficiency by 3% mW to 4% mW, while providing both the first anti-reflective coating 51 and the second anti-reflective coating 52 can increase the light extraction efficiency by about 6% mW to 9% mW.

Furthermore, the protective layer 6 extends at the side to sequentially cover the first anti-reflective coating 51 and the cover 4, and according to the structural configuration, further extends to cover the first adhesive 71 (and the second anti-reflective coating 52), the side wall 3, the second adhesive 72, and part of the substrate 1, so that heterojunctions and joints resulting from non-integral formation are effectively covered, thereby preventing moisture from intruding into the enclosed space A under long term use or in high temperature and high humidity environments.

In addition, the light emitting structure provided by the present disclosure further includes a blocking structure 8 disposed on the substrate 1 to provide a predetermined distance between the side wall 3 and the at least one light emitting chip 2. In other words, the blocking structure 8 is a limiting means disposed on the substrate 1 such that the side wall 3 may be located according to a predetermined distance and position. In addition, the material of the blocking structure 8 is an ultraviolet resistant material. As such, the blocking structure 8 is disposed between the at least one light emitting chip 2 and the second adhesive 72, and can block ultraviolet light emitted by the at least one light emitting chip 2, so as to prevent direct irradiation onto the second adhesive 72 that leads to aging.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light emitting structure, comprising:
a substrate;
at least one light emitting chip disposed on the substrate;
a side wall disposed on the substrate and surrounding the at least one light emitting chip;
a cover disposed on the side wall, wherein the cover, the side wall and the substrate surrounds and defines an enclosed space for accommodating the at least one light emitting chip;
an anti-reflective coating disposed on the cover; and
a protective layer disposed on outside of the anti-reflective coating,
wherein the protective layer is a fluorine-based polymer having a hydroxyl group, and has a following structure:

COOH—(CF$_2$=CFCF$_2$CF$_2$—O—CF=CF$_2$)$_m$—COOH, where m is a positive integer from 18 to $1.5*10^5$.

2. The light emitting structure according to claim 1, wherein at least one adhesive is disposed at a junction of the side wall and the substrate and/or the cover, and the at least one adhesive is covered by the protective layer.

3. The light emitting structure according to claim 2, wherein the protective layer includes a body portion located on the cover and an extension portion extending towards the side wall covering the adhesive at the junction of the cover and the side wall or towards the substrate covering the adhesive at the junction of the side wall and the substrate.

4. The light emitting structure according to claim 2, wherein the cover has opposing first and second surfaces, the anti-reflective coating includes a first anti-reflective coating disposed on the first surface of the cover and a second anti-reflective coating disposed on the second surface of the cover.

5. The light emitting structure according to claim 2, wherein the side wall and the cover are integrally formed, a first adhesive is disposed at the junction of the side wall and the substrate, and the first adhesive is covered by the protective layer.

6. The light emitting structure according to claim 2, wherein the side wall and the substrate are integrally formed, a second adhesive is disposed at the junction of the side wall and the cover, and the second adhesive is covered by the protective layer.

7. The light emitting structure according to claim 2, wherein a first adhesive is disposed at the junction of the side wall and the cover, and a second adhesive is disposed at the junction of the side wall and the substrate, and the first adhesive and the second adhesive are covered by the protective layer.

8. The light emitting structure according to claim 2, further comprising a blocking structure disposed on the substrate to provide a predetermined distance between the side wall and the at least one light emitting chip.

9. The light emitting structure according to claim 8, wherein the blocking structure is sequentially stacked in a multilayer structure.

10. The light emitting structure according to claim 8, wherein the side wall has a metal multi-layer structure being formed by sequential stacking and deposition on the substrate.

11. The light emitting structure according to claim 1, wherein the at least one light emitting chip emitting light in a wavelength range from 200 nm to 400 nm.

12. The light emitting structure according to claim 1, wherein the side wall has a multi-layer structure formed by sequential stacking.

13. The light emitting structure according to claim 1, wherein the side wall is in stepped shape, vertical shape or inclined shape.

14. The light emitting structure according to claim 1, wherein the cover has opposing first and second surfaces, and the anti-reflective coating includes a first anti-reflective coating disposed on the first surface of the cover and a second anti-reflective coating disposed on the second surface of the cover.

15. The light emitting structure according to claim 1, wherein a thickness of the protective layer is between 30 nm and 120 nm, and meets the following relationship:

the thickness of the protective layer ($T$)=the emission wavelength ($\lambda$) of the light emitting chip/4.

16. The light emitting structure according to claim 1, wherein a thickness of the anti-reflective coating is between 30 nm and 120 nm, and the material of the anti-reflective coating is selected from silicon dioxide with oxide.

17. The light emitting structure according to claim 1, wherein the refractive index of the cover is larger than the refractive indexes of the protective layer and the anti-reflective coating.

18. The light emitting structure according to claim 1, wherein the cover is planar lens, a dome lens, a hollow dome lens, or a hollow square lens.

19. A light emitting structure, comprising:
a substrate;
at least one light emitting chip disposed on the substrate;
a side wall disposed on the substrate and surrounding the at least one light emitting chip;
a cover disposed on the side wall, wherein the cover, the side wall and the substrate surrounds and defines an enclosed space for accommodating the at least one light emitting chip;
an anti-reflective coating disposed on the cover; and
a protective layer disposed on outside of the anti-reflective coating;
wherein a thickness of the protective layer is between 30 nm and 120 nm, and meets the following relationship:

the thickness of the protective layer ($T$)=the emission wavelength ($\lambda$) of the light emitting chip/4.

20. A light emitting structure, comprising:
a substrate;
at least one light emitting chip disposed on the substrate;
a side wall disposed on the substrate and surrounding the at least one light emitting chip;
a cover disposed on the side wall, wherein the cover, the side wall and the substrate surrounds and defines an enclosed space for accommodating the at least one light emitting chip;

an anti-reflective coating disposed on the cover; and
a protective layer disposed on outside of the anti-reflective coating;
wherein the cover is a planar lens, a dome lens, a hollow dome lens, or a hollow square lens.

\* \* \* \* \*